United States Patent
Henry et al.

(10) Patent No.: US 10,403,565 B1
(45) Date of Patent: Sep. 3, 2019

(54) ELECTRICAL CONNECTOR WITH LEAD FRAME MODULES

(71) Applicant: TE CONNECTIVITY CORPORATION, Berwyn, PA (US)

(72) Inventors: Randall Robert Henry, Lebanon, PA (US); Michael John Phillips, Camp Hill, PA (US); Michael Joseph Tryson, Spring Grove, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/948,008

(22) Filed: Apr. 9, 2018

(51) Int. Cl.
| | | |
|---|---|---|
| *H01R 13/648* | (2006.01) | |
| *H01R 24/00* | (2011.01) | |
| *H01L 23/495* | (2006.01) | |
| *H01L 23/528* | (2006.01) | |

(52) U.S. Cl.
CPC .. *H01L 23/49517* (2013.01); *H01L 23/49541* (2013.01); *H01L 23/5286* (2013.01)

(58) Field of Classification Search
None
See application file for complete search history.

(56) References Cited

U.S. PATENT DOCUMENTS

| | | | |
|---|---|---|---|
| 6,565,387 | B2 | 5/2003 | Cohen |
| 2006/0166551 | A1 | 7/2006 | Korsunsky et al. |
| 2016/0064869 | A1* | 3/2016 | Yu .......................... H01R 24/60 439/607.05 |
| 2016/0118750 | A1* | 4/2016 | Guo ................... H01R 13/6585 439/78 |
| 2016/0294121 | A1* | 10/2016 | Daughtry, Jr. ....... H01R 13/405 |
| 2018/0076581 | A1* | 3/2018 | Tsai .................... H01R 13/6585 |
| 2018/0115118 | A1* | 4/2018 | Zhao .................. H01R 13/6585 |
| 2018/0115119 | A1* | 4/2018 | Little ................... H01R 4/2404 |
| 2018/0145462 | A1* | 5/2018 | Feng .................. H01R 13/6596 |

\* cited by examiner

*Primary Examiner* — Xuong M Chung Trans

(57) ABSTRACT

A lead frame module of an electrical connector includes a ground lead frame, signal conductors, a dielectric holder, and a ground plate. The ground lead frame includes multiple ground conductors and a tie bar that extends between and connects the ground conductors. The signal conductors are interleaved with the ground conductors. The signal conductors have jogged segments that extend across the tie bar around an outer side of the tie bar without engaging the tie bar. The dielectric holder at least partially surrounds the signal conductors and the ground lead frame to secure the signal conductors relative to the ground lead frame. The ground plate is disposed along an interior side of the dielectric holder and engages an inner side of the tie bar, which is opposite the outer side, to electrically connect the ground plate to the ground lead frame.

21 Claims, 8 Drawing Sheets

ELECTRICAL CONNECTOR WITH LEAD FRAME MODULES

BACKGROUND OF THE INVENTION

The subject matter herein relates generally to electrical connectors with lead frame modules that provide shielded signal conductors.

Some electrical connectors include signal conductors held in discrete packages, referred to as contact modules or wafers, which are laterally stacked side by side within a connector housing. The electrical connectors may include ground shields disposed between the signal conductors of adjacent contact modules in order to reduce crosstalk between the signal conductors of the adjacent contact modules, and thereby improve signal integrity and connector performance relative to connectors that lack intervening ground shields. The electrical characteristics may be further improved by electrically connecting the ground shields along opposite sides of the contact modules to electrically common the ground shields.

Some electrical connectors are designed to include ground skewers that extend across the contact modules through defined openings in the contact modules to allow the ground skewers to mechanically engage the ground shields along opposite sides of the contact modules. However, designing and/or assembling an electrical connector with such ground skewers to electrically common the ground shields may increase the complexity and cost of the electrical connector due to additional parts, tooling, and labor relative to connectors that lack ground skewers. Reliability of the electrical connectors may also suffer because it may be difficult to ensure that the ground skewers align with openings of the contact modules and engage the ground shields. Furthermore, existing ground shields, with or without ground skewers, may not adequately block electrical interference (e.g., cross-talk) vertically transmitted between signal conductors within the same contact modules, especially at high signal speeds.

A need remains for an electrical connector that efficiently and reliably provides sufficient electrical shielding for the signal conductors of the connector to prohibit cross-talk and other interference, thereby improving signal integrity.

BRIEF DESCRIPTION OF THE INVENTION

In one or more embodiments of the present disclosure, a lead frame module of an electrical connector is provided. The lead frame module includes a ground lead frame, signal conductors, a dielectric holder, and a ground plate. The ground lead frame includes multiple ground conductors that extend parallel to one another and a tie bar that extends between and connects the ground conductors. The signal conductors are interleaved with the ground conductors and disposed side-by-side with the ground conductors along a lateral axis of the lead frame module. The signal conductors have jogged segments that extend across the tie bar around an outer side of the tie bar without engaging the tie bar. The dielectric holder at least partially surrounds the signal conductors and the ground lead frame to secure the signal conductors relative to the ground lead frame. The ground plate is disposed along an interior side of the dielectric holder and engages an inner side of the tie bar, which is opposite the outer side, to electrically connect the ground plate to the ground lead frame.

In one or more embodiments of the present disclosure, an electrical connector is provided that includes a first lead frame module and a second lead frame module disposed on opposite sides of a module interface. Each of the first and second lead frame modules includes a ground lead frame, signal conductors, and a ground plate. The ground lead frame includes multiple ground conductors that extend parallel to one another and a tie bar that extends between and connects the ground conductors. The signal conductors are interleaved with the ground conductors. The signal conductors cross the tie bar by extending around a respective outer side of the tie bar without engaging the tie bar. The ground plate engages a respective inner side of the tie bar, which is opposite the outer side, to electrically connect the ground plate to the ground lead frame. The inner sides of the tie bars of the first and second lead frame modules face towards the module interface. The ground plate of the first lead frame module engages the ground plate of the second lead frame module at multiple points of contact to electrically connect the first and second lead frame modules.

In one or more embodiments of the present disclosure, a lead frame module of an electrical connector is provided. The lead frame module includes a ground lead frame, signal conductors, and a dielectric holder. The ground lead frame includes multiple ground conductors that extend parallel to one another and a tie bar that extends between and connects the ground conductors. The signal conductors are interleaved with the ground conductors and disposed side-by-side with the ground conductors along a lateral axis of the lead frame module. The signal conductors have jogged segments that extend across the tie bar around an outer side of the tie bar without engaging the tie bar. The dielectric holder has an overmold body that encases lengths of the signal conductors and the ground conductors to secure the signal conductors relative to the ground lead frame. The overmold body covers the outer side of the tie bar. An inner side of the tie bar, which is opposite the outer side, is exposed through the dielectric holder for engaging a ground plate to electrically connect the ground lead frame to the ground plate.

DETAILED DESCRIPTION OF THE INVENTION

Embodiments of the present disclosure provide an electrical connector that includes multiple lead frame modules. The lead frame modules are configured to provide better electrical shielding around the signal conductors than known electrical connectors, thereby improving signal integrity. For example, the embodiments of the electrical connector may offer improved electrical isolation between signal conductors of different lead frame modules. The embodiments of the electrical connector may be configured to provide high speed signal transmission up to or exceeding 56 Gb/s. In addition, the embodiments of the electrical connector described herein may be less costly and/or complex than known electrical connectors that install ground skewers through openings in contact modules to electrically connect ground shields.

Figure 1:
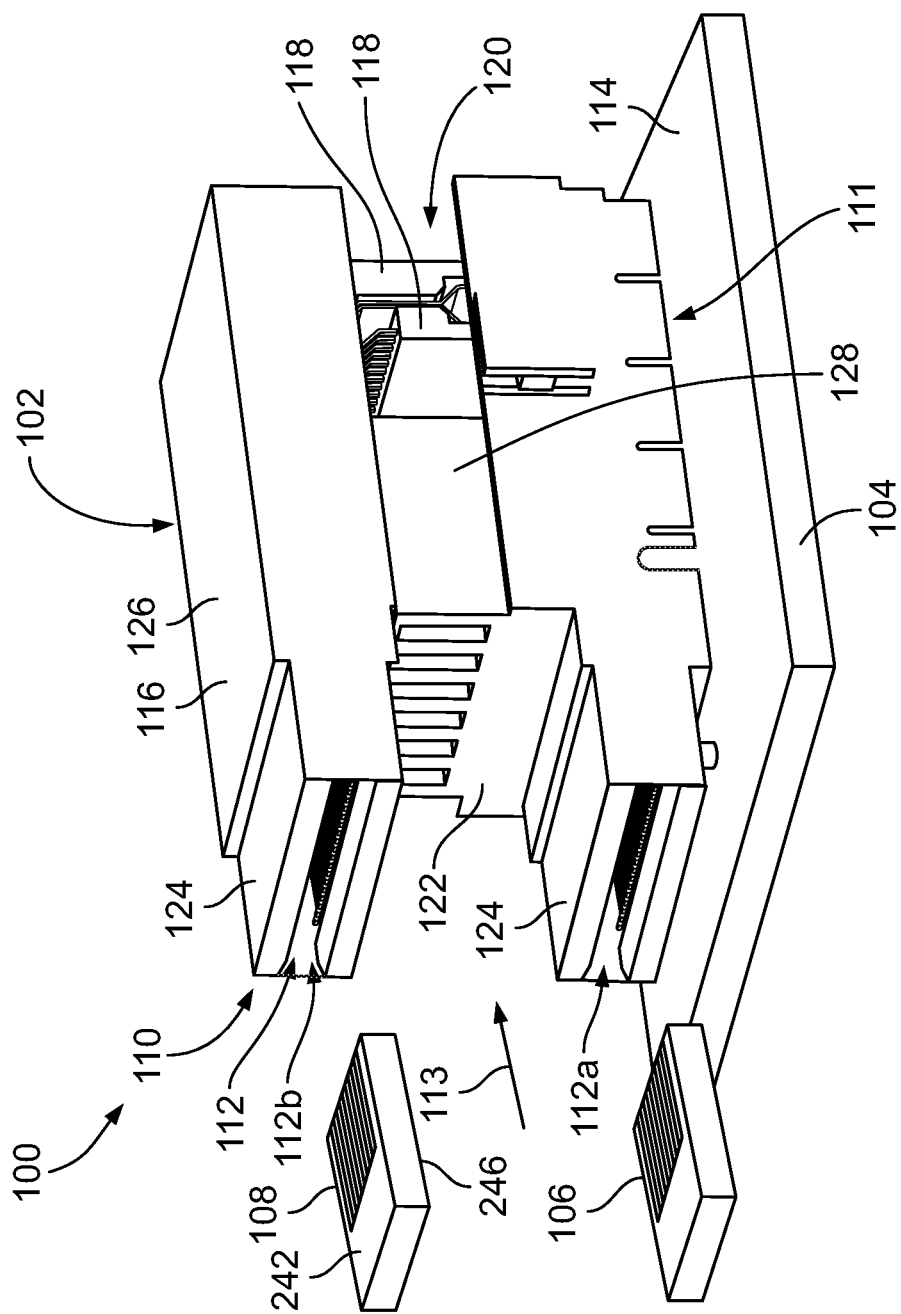
FIG. 1 is a perspective view of a connector system in accordance with an embodiment.

FIG. 1 is a perspective view of a connector system 100 in accordance with an embodiment. The connector system 100 includes an electrical connector 102 that is mounted on a circuit board 104. The connector system 100 further includes first and second mating circuit cards 106, 108 that are configured to mate with the electrical connector 102 to electrically connect the mating circuit cards 106, 108 to the circuit board 104 via the electrical connector 102. Each of the mating circuit cards 106, 108 may be part of a mating connector (not shown), such as a cable-mounted plug connector. For example, the mating circuit cards 106, 108 may be components of respective input/output (I/O) transceiver connectors configured to transmit information in the form of electrical signals and/or optical signals. The first and second mating circuit cards 106, 108 are discrete from each other and are independently mated to the electrical connector 102.

The electrical connector 102 has a mating end 110 and a mounting end 111. The mating end 110 includes two ports 112 that are configured to receive the mating circuit cards 106, 108 therein. The two ports 112 have a stacked arrangement in the illustrated embodiment, such that a lower port 112a of the two ports 112 is vertically disposed between the circuit board 104 and an upper port 112b of the two ports 112. In the illustrated embodiment, the first mating circuit card 106 is poised for insertion into the lower port 112a and the second mating circuit card 108 is poised for insertion into the upper port 112b, but each of the ports 112a, 112b may be configured to receive either of the mating circuit cards 106, 108. The electrical connector 102 may have only one port 112 or three or more ports 112 in an alternative embodiment.

The mounting end 111 of the electrical connector 102 mechanically mounts to, and electrically connects to, the circuit board 104. In the illustrated embodiment, the electrical connector 102 is a right angle connector such that a plane of the mating end 110 is oriented perpendicular to a plane of the mounting end 111. Due to the right angle orientation, the mating circuit cards 106, 108 are configured to be loaded into the ports 112 in a loading direction 113 that is parallel to a mounting surface 114 of the circuit board 104. In an alternative embodiment, the electrical connector 102 may be an in-line connector such that the mating end 110 and the mounting end 111 are at opposite ends of the connector 102, and the mating circuit cards 106, 108 are received into the ports 112 in a loading direction that is perpendicular to the mounting surface 114 of the circuit board 104.

The electrical connector 102 includes a housing 116 that defines the ports 112. The housing 116 may extend from the mating end 110 to the mounting end 111. The housing 116 holds a plurality of lead frame modules 118. For example, the housing 116 may define a cavity 120, and the lead frame modules 118 may be at least partially disposed within the cavity 120. The housing 116 may include a dielectric material, such as one or more plastics. The housing 116 may structurally support the lead frame modules 118 and retain the lead frame modules 118 in a fixed position relative to the housing 116. The housing 116 may also provide electrical insulation and/or protection for the lead frame modules 118 against debris, external impacts, and the like. In the illustrated embodiment, the housing 116 has multiple walls, including a front wall 122. The housing 116 also has two mating shrouds 124 projecting forward from the front wall 122 to the mating end 110 of the electrical connector 102. The ports 112 are defined within the mating shrouds 124.

In addition to the front wall 122, the housing 116 in the illustrated embodiment has a top wall 126, a first side wall 128, and a second side wall (not shown) that is opposite the first side wall 128. Each of the top wall 126, the first side wall 128, and the second side wall extends rearward from the front wall 122. As used herein, relative or spatial terms such as "top," "bottom," "upper," "lower," "front," and "rear" are only used to distinguish the referenced elements and do not necessarily require particular positions or orientations relative to gravity and/or the surrounding environment of the connector system 100. Although not visible in FIG. 1, the housing 116 may be at least partially open at the mounting end 111 of the electrical connector 102 to allow the lead frame modules 118 to electrically connect to the circuit board 104 via thru-hole or surface mount termination.

Figure 2:
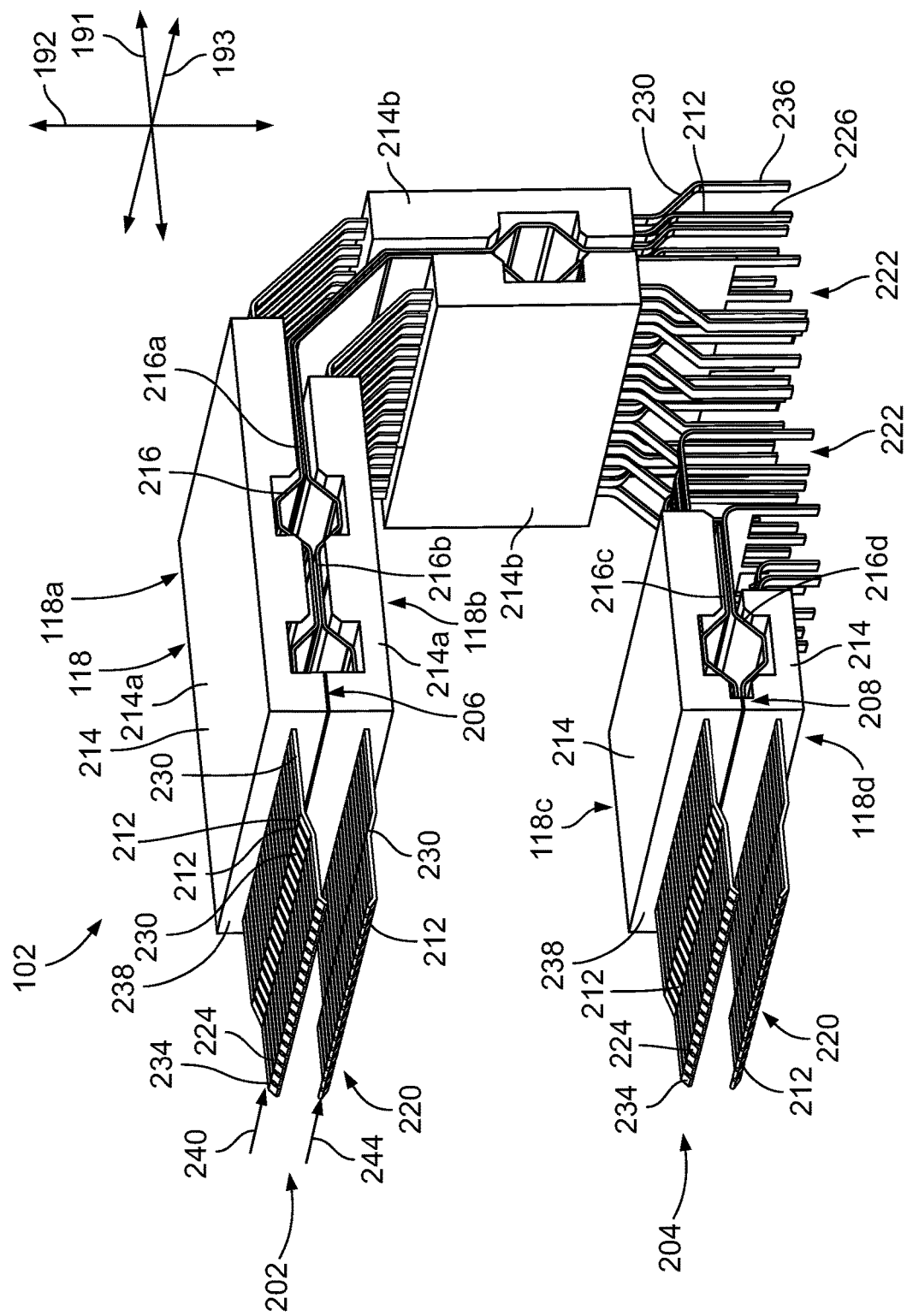
FIG. 2 is a perspective view of an embodiment of an electrical connector of the connector system, with the housing thereof omitted to show lead frame modules of the electrical connector.

FIG. 2 is a perspective view of an embodiment of the electrical connector 102 with the housing 116 (shown in FIG. 1) omitted to show the lead frame modules 118 of the electrical connector 102. In the illustrated embodiment, the electrical connector 102 includes four lead frame modules 118. The lead frame modules 118 are organized into a first sub-assembly 202 and a second sub-assembly 204. Each of the sub-assemblies 202, 204 includes two corresponding lead frame modules 118. The first sub-assembly 202 aligns with the upper port 112b (FIG. 1) of the housing 116 and provides electrically conductive signal paths from the upper port 112b to the circuit board 104 (FIG. 1). The second sub-assembly 204 aligns with the lower port 112a (FIG. 1) of the housing 116 and provides electrically conductive signal paths from the lower port 112a to the circuit board 104. The first and second sub-assemblies 202, 204 are oriented with respect to a longitudinal or depth axis 191, a vertical axis 192, and a lateral axis 193. The axes 191-193 are mutually perpendicular. Although the vertical axis 192 appears to extend in a vertical direction parallel to gravity in FIG. 2, it is understood that the axes 191-193 are not required to have any particular orientation with respect to gravity. The first sub-assembly 202 is taller (e.g., along the vertical axis 192) and defines longer conductive signal paths than the second sub-assembly 204. As used herein, the first sub-assembly 202 is referred to as the tall sub-assembly 202, and the second sub-assembly 204 is referred to as the short sub-assembly 204.

The tall sub-assembly 202 includes a first lead frame module 118a and a second lead frame module 118b. The first and second lead frame modules 118a, 118b are disposed along opposite sides of a respective module interface 206 (shown in more detail in FIG. 3). The first and second lead frame modules 118a, 118b engage each other at the module interface 206 to electrically connect the first and second lead frame modules 118a, 118b. The short sub-assembly 204 includes a third lead frame module 118c and a fourth lead frame module 118d. The third and fourth lead frame modules 118c, 118d are disposed along opposite sides of a respective module interface 208 (shown in more detail in FIG. 3), and engage each other at the module interface 208 to electrically connect the third and fourth lead frame modules 118c, 118d. The tall sub-assembly 202 is spaced apart from the short sub-assembly 204, as shown more clearly in the side view of FIG. 3, such that the first and second lead frame modules 118a, 118b are mechanically separate from the third and fourth lead frame modules 118c, 118d.

In the illustrated embodiment, all four of the lead frame modules 118a-d have similar components, although the components may have different physical dimensions and/or orientations, as described herein. For example, each of the lead frame modules 118a-d includes a respective ground lead frame 210 (shown in FIG. 4), respective signal conductors 212, at least one respective dielectric holder 214, and a respective ground plate 216. The ground lead frame 210 includes multiple ground conductors 230. The at least one dielectric holder 214 at least partially surrounds the respective signal conductors 212 and the ground lead frame 210 to secure the positions of the signal conductors 212 and the ground lead frame 210. The ground plate 216 of each lead frame module 118 mechanically engages the respective ground lead frame 210 to electrically connect the ground plate 216 to the ground lead frame 210.

The ground plates 216 of the lead frame modules 118 are located at the corresponding module interfaces 206, 208 and provide shielding between the signal conductors 212 of the lead frame modules 118 on either side thereof. For example, the ground plate 216a of the first lead frame module 118a and the ground plate 216b of the second lead frame module 118b both extend along the module interface 206 and provide shielding to block cross-talk and other electrical interference between the signal conductors 212 of the first and second lead frame modules 118a, 118b. The ground plate 216a engages the ground plate 216b at the module interface 206 to electrically connect (e.g., at a common electrical potential) the first and second lead frame modules 118a, 118b. Similarly, the ground plate 216c of the third lead frame module 118c and the ground plate 216d of the fourth lead frame module 118d both extend along the module interface 208 and provide shielding to block cross-talk and other electrical interference between the signal conductors 212 of the third and fourth lead frame modules 118c, 118d. The ground plate 216c engages the ground plate 216d at the module interface 208 to electrically connect the third and fourth lead frame modules 118c, 118d.

In an alternative embodiment, the tall sub-assembly 202 only includes one ground plate 216 at the module interface 206 (e.g., either the ground plate 216a or the ground plate 216b, but not both). Alternatively, or additionally, the short sub-assembly 204 only includes one ground plate 216 at the module interface 208. The single ground plate 216 may be configured to mechanically engage both of the ground lead frames 210 of the two lead frame modules 118 on either side of the ground plate 216 to electrically connect the two lead frame modules 118 across the respective module interface 206, 208.

Each of the lead frame modules 118a-d extends from a mating end 220 to a terminating end 222. The ground conductors 230 of the ground lead frame 210 (FIG. 4) and the signal conductors 212 of each lead frame module 118 extend continuously from the mating end 220 to the terminating end 222. As shown in more detail in FIG. 5, the signal conductors 212 are interleaved with the ground conductors 230 and disposed side-by-side along the lateral axis 193. The signal conductors 212 include or define mating contacts 224 at the mating end 220 that are configured to engage the mating circuit cards 106, 108 (FIG. 1) within the respective ports 112a, 112b (FIG. 1). The signal conductors 212 also include or define contact tails 226 at the terminating end 222 configured to be surface mounted or thru-hole mounted to the circuit board 104 (FIG. 1). For example, the contact tails 226 may be posts for thru-hole mounting, bent tips for surface mounting, or the like.

The ground conductors 230 also include or define mating contacts 234 at the mating end 220 and contact tails 236 at the terminating end 222. The mating contacts 234 may be similar in size, shape, and positioning to the mating contacts 224 of the signal conductors 212. The contact tails 236 may be similar in size and shape to the contact tails 226 of the signal conductors 212. In the illustrated embodiment, the contact tails 236 of the ground conductors 230 are offset positionally from the contact tails 226 of the signal conductors 212, which may be based on the circuit layout of the circuit board 104.

The mating contacts 224, 234 of each lead frame module 118 project beyond a front edge 238 of a corresponding dielectric holder 214 to the mating end 220. The mating contacts 224, 234 of each lead frame module 118 are arranged in-line along a row that is parallel to the lateral axis 193. For example, the row 240 defined by the mating contacts 224, 234 of the first lead frame module 118a is a top row within the upper port 112b (shown in FIG. 1) of the housing 116 (FIG. 1). The top row 240 is configured to engage a first or upper side 242 (FIG. 1) of the mating circuit card 108 that is loaded into the upper port 112b. The mating contacts 224, 234 of the second lead frame module 118b define a bottom row 244 within the upper port 112b that is configured to engage a second or lower side 246 (FIG. 1) of the same mating circuit card 108. The upper and lower sides 242, 246 are opposite one another. In the illustrated embodiment, both the tall sub-assembly 202 and the short sub-assembly 204 are dual row sub-assemblies, with each of the two lead frame modules 118 thereof defining one of the two rows.

The dielectric holders 214 of the lead frame modules 118 are elongated laterally (e.g., parallel to the lateral axis 193). In the illustrated embodiment, each dielectric holder 214 engages each of the signal conductors 212 and the ground conductors 230 within the respective lead frame module 118. For example, a first dielectric holder 214a of the first lead frame module 118a is elongated laterally and engages all of the signal conductors 212 and the ground conductors 230 of the first lead frame module 118a. Similarly, the dielectric holder 214 of the third lead frame module 118c engages all of the signal conductors 212 and the ground conductors 230 of the third lead frame module 118c. In the illustrated embodiment, each of the first and second lead frame modules 118a, 118b has two respective dielectric holders 214a, 214b that are spaced apart from each other along the length of the tall sub-assembly 202. The first dielectric holders 214a of the first and second lead frame modules 118a, 118b are elongated laterally and longitudinally (e.g., along the longitudinal axis 191), and are relatively thin or narrow along the vertical axis 192. The second dielectric holders 214b of the first and second lead frame modules 118a, 118b are elongated laterally and vertically (e.g., along the vertical axis 192), and are relatively thin or narrow along the longitudinal axis 191.

The third and fourth lead frame modules 118c, 118d only include one dielectric holder 214, due to the shorter length. The dielectric holders 214 of the third and fourth lead frame modules 118c, 118d are elongated laterally and longitudinally, similar to the first dielectric holders 214a. But, in an alternative embodiment, at least some of the lead frame modules 118a-d may have a different number of dielectric holders 214 than the illustrated embodiment. For example, the third and fourth lead frame modules 118c, 118d may each have two dielectric holders 214 and/or the first and second lead frame modules 118a, 118b may each have only one dielectric holder 214 or at least three dielectric holders 214.

The dielectric holders 214 of the lead frame modules 118 are arranged and/or oriented differently from dielectric holders or wafers of some known electrical connectors, which may be elongated vertically and longitudinally, instead of laterally, and may be stacked side to side with other wafers along the lateral axis 193.

Figure 3:
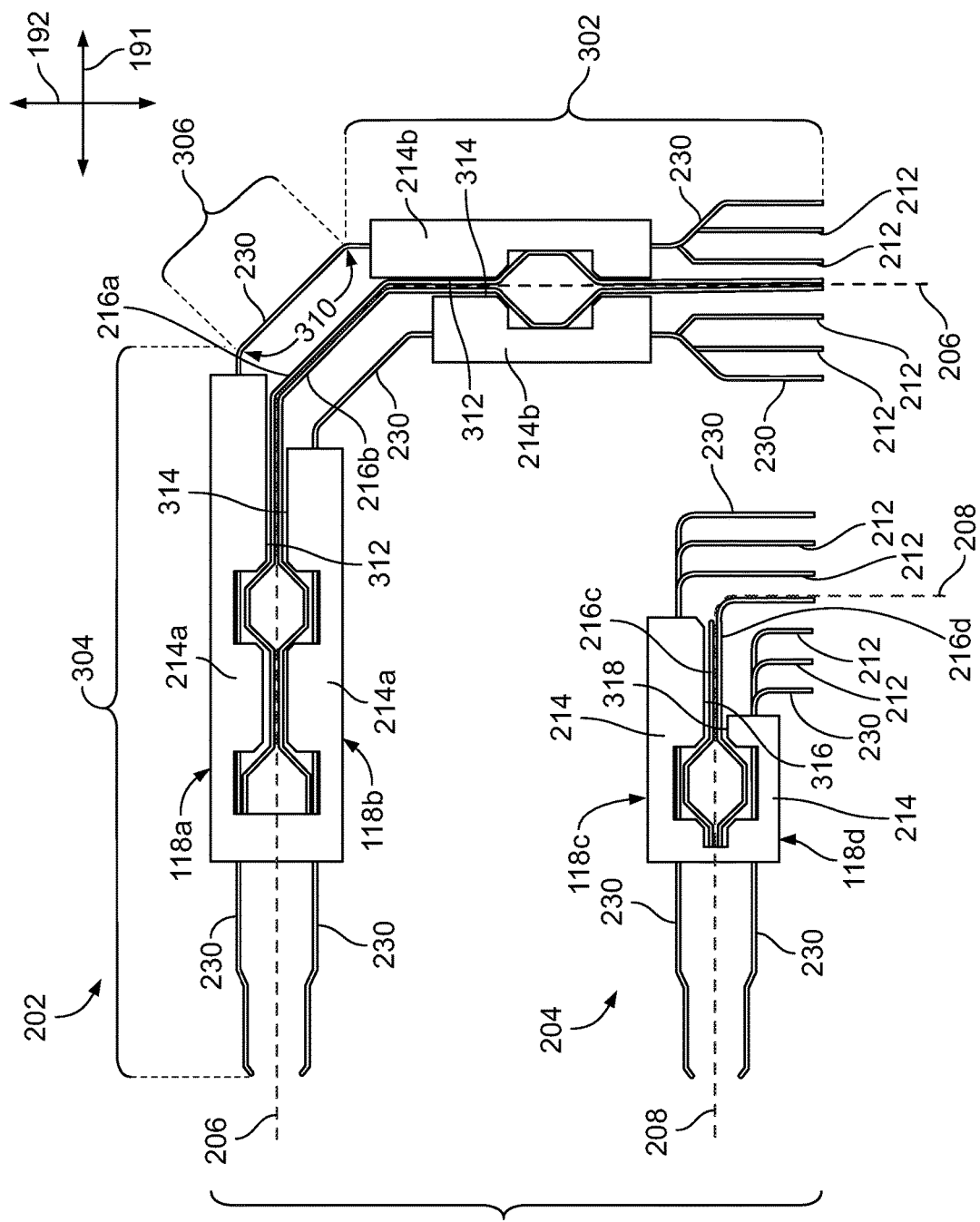
FIG. 3 is a side view of the lead frame modules of the electrical connector.

FIG. 3 is a side view of the tall and short sub-assemblies 202, 204 shown in FIG. 2. The sub-assemblies 202, 204 in the illustrated embodiment have right angle configurations. For example, the signal conductors 212 and the ground conductors 230 of the first lead frame module 118a define a vertical region 302 that extends generally parallel to the vertical axis 192, a horizontal region 304 that extends generally parallel to the longitudinal axis 191, and a bend region 306 disposed therebetween. As used herein, the term "generally parallel" means within a designated angular range, such as within 5 degree, 10 degrees, or 15 degrees. The vertical region 302 may be oriented perpendicular to the horizontal region 304. The bend region 306 provides a generally right angle curve. In the illustrated embodiment, the bend region 306 includes two 45 degree angles 310, but the bend region 306 may have other shapes in other embodiments, such as a single 90 degree curve, three 30 degree angles, or the like.

The first dielectric holder 214a of the first lead frame module 118a at least partially surrounds the signal conductors 212 and the ground conductors 230 along the horizontal region 304, and the second dielectric holder 214b at least partially surrounds the signal conductors 212 and the ground conductors 230 along the vertical region 302. In the illustrated embodiment, the first and second dielectric holders 214a, 214b do not extend along the bend region 306. In an alternative embodiment, the bend region 306 may be at least partially surrounded by a dielectric holder, such as the first dielectric holder 214a, the second dielectric holder 214b, or a discrete, third dielectric holder (not shown). Although not individually labeled in FIG. 3, the other lead frame modules 118c-d also include vertical regions, horizontal regions, and bend regions similar to the regions 302, 304, 306 of the first lead frame module 118a.

The module interfaces 206, 208 of the tall and short sub-assemblies 202, 204 follow the right angle configurations. The arrangement and orientation of the first lead frame module 118a generally mirrors the second lead frame module 118b across the module interface 206. For example, the ground plate 216a of the first lead frame module 118a is disposed along interior sides 312 of the respective first and second dielectric holders 214a, 214b of the first lead frame module 118a. The ground plate 216a may, or may not, mechanically engage the interior sides 312. The interior sides 312 face towards the module interface 206. On the other side of the module interface 206, the ground plate 216b of the second lead frame module 118b is disposed along interior sides 314 of the respective first and second dielectric holders 214a, 214b of the second lead frame module 118b. The interior sides 314 face towards the module interface 206 (and towards the interior sides 312 across the module interface 206). Therefore, the ground plates 216a, 216b are stacked along the module interface 206 between the dielectric holders 214a, 214b of the first lead frame module 118a and the dielectric holders 214a, 214b of the second lead frame module 118b. Since the first dielectric holder 214a of the first lead frame module 118a is disposed above the first dielectric holder 214a of the second lead frame module 118b along the vertical axis 192, the first lead frame module 118a may be referred to as an upper lead frame module 118a of the tall sub-assembly 202, and the second lead frame module 118b may be referred to as a lower lead frame module 118b of the tall sub-assembly 202.

The arrangement and orientation of the third lead frame module 118c generally mirrors the fourth lead frame module 118d across the module interface 208, similar to the first and second lead frame modules 118a, 118b. For example, the ground plates 216c, 216d are both located between the dielectric holders 214 of the third and fourth lead frame modules 118c, 118d. More specifically, the ground plates 216c, 216d are disposed between an interior side 316 of the dielectric holder 214 of the third lead frame module 118c and an interior side 318 of the dielectric holder 214 of the fourth lead frame module 118d. Since the dielectric holder 214 of the fourth lead frame module 118d is closer to the circuit board 104 (FIG. 1) than the dielectric holder 214 of the third lead frame module 118c along the vertical axis 192, the third lead frame module 118c may be referred to as an upper lead frame module 118c of the short sub-assembly 204, and the fourth lead frame module 118d may be referred to as a lower lead frame module 118d of the short sub-assembly 204.

Figure 4:
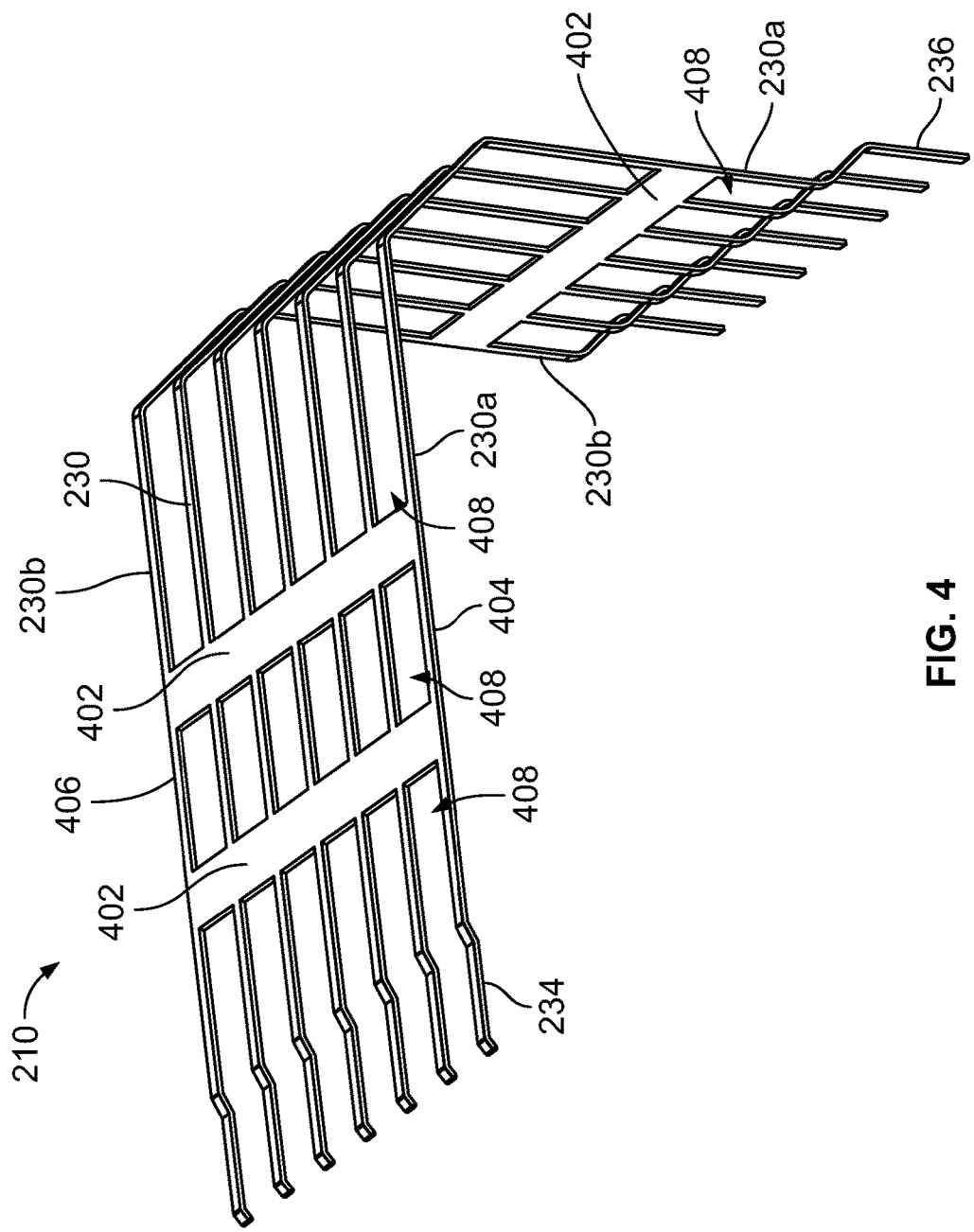
FIG. 4 is a perspective view of an embodiment of a ground lead frame of one of the lead frame modules of the electrical connector.

FIG. 4 is a perspective view of an embodiment of the ground lead frame 210 of the first lead frame module 118a of the electrical connector 102 shown in FIG. 2. The ground lead frame 210 includes multiple ground conductors 230 and multiple tie bars 402 that extend across the ground conductors 230. The ground conductors 230 extend lengths from the mating contacts 234 to the contact tails 236. Optionally, the ground conductors 230 may be parallel to one another. The tie bars 402 extend between and engage the ground conductors 230. The tie bars 402 electrically connect adjacent ground conductors 230 together. For example, two adjacent ground conductors 230 may be connected to each other via the tie bars 402. In the illustrated embodiment, each tie bar 402 extends continuously across the entire lateral width of the ground lead frame 210 from an outer ground conductor 230a at a first lateral edge 404 of the ground lead frame 210 to an outer ground conductor 230b at the opposite, second lateral edge 406 of the ground lead frame 210. Optionally, the tie bars 402 may be coplanar with the ground conductors 230.

The tie bars 402 and the ground conductors 230 generally provide a lattice that defines multiple spaces or windows 408. For example, each window 408 is laterally bounded (or defined) by two adjacent ground conductors 230, and is longitudinally or vertically bounded on at least one side by a corresponding tie bar 402. Some of the windows 408 are bounded by two tie bars 402, while others are bounded by only one tie bar 402 and are open or un-bounded opposite the corresponding tie bar 402.

In an embodiment, the ground lead frame 210 is unitary and monolithic, such that the tie bars 402 are integrally connected to the ground conductors 230. For example, the ground lead frame 210 may be stamped and formed from a single sheet or panel of metal. The stamping process may remove portions of the metal sheet to produce the windows 408, and thereby define the ground conductors 230 and the tie bars 402. Optionally, the ground lead frame 210 may be stamped when flat, and then subsequently formed (e.g., bent) into the right angle configuration shown in FIG. 4. The formation of the ground lead frame 210 may include contouring the mating contacts 234 and jogging the contact tails 236 into the illustrated shapes. Although the ground lead frame 210 includes three tie bars 402 in the illustrated embodiment, the ground lead frame 210 may have a different number and/or position of the tie bars 402 in an alternative embodiment.

Although not shown in FIG. 4, the ground lead frames 210 of the other lead frame modules 118b-d may be similar to the illustrated ground lead frame 210, including multiple ground conductors 230 and at least one tie bar 402. The ground lead frame 210 of the second lead frame module 118b may, but need not, have the same number of tie bars 402 as the ground lead frame 210 of the first lead frame module 118a shown in FIG. 4. The ground lead frame 210 of the second lead frame module 118b may mirror the illustrated ground lead frame 210, at least with reference to the mating contacts 224 and optionally the contact tails 236 as well. The ground lead frame 210 of the second lead frame module 118b may also have slightly reduced lengths relative to the lengths of the illustrated ground lead frame 210. The ground lead frames 210 of the third and fourth lead frame modules 118c, 118d may have fewer tie bars 402 than the illustrated ground lead frame 210, such as only a single tie bar 402.

Figure 5:
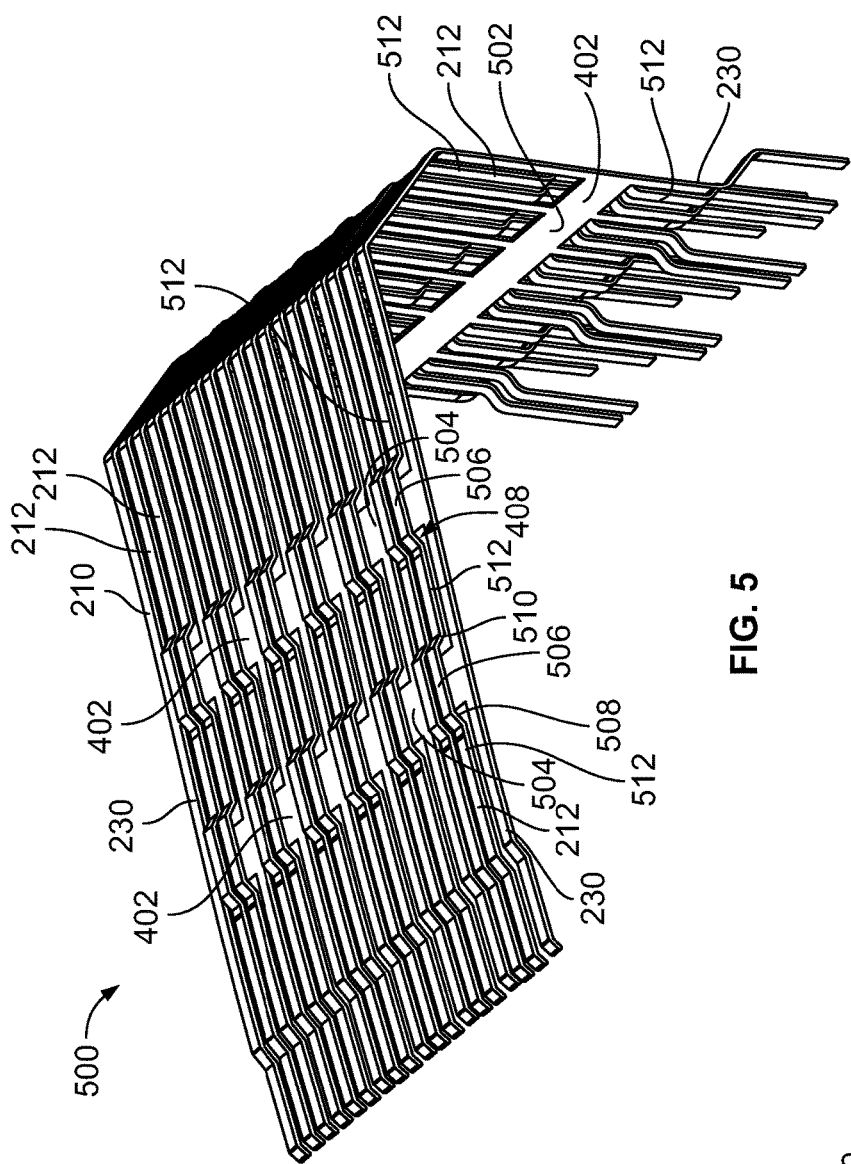
FIG. 5 is a perspective view of an embodiment of a lead frame assembly of the lead frame module of FIG. 4.

FIG. 5 is a perspective view of an embodiment of a lead frame assembly 500 of the first lead frame module 118a of the electrical connector 102 shown in FIG. 2. The lead frame assembly 500 includes the signal conductors 212 and the ground lead frame 210. The signal conductors 212 are interleaved with the ground conductors 230 of the ground lead frame 210. The signal conductors 212 are disposed side-by-side the ground conductors 230 along the lateral axis 193 (FIG. 2). The signal conductors 212 are spaced apart and mechanically separate from the ground lead frame 210, although the signal conductors 212 may be proximate to the ground conductors 230 and the tie bars 402 of the ground lead frame 210. The signal conductors 212 extend across the tie bars 402 without engaging the tie bars 402. Each of the tie bars 402 includes an inner side 502 and an outer side 504 that is opposite the inner side 502. The inner side 502 faces towards the respective module interface 206 (shown in FIG. 3) of the tall sub-assembly 202 (FIG. 3). In the illustrated embodiment, the signal conductors 212 extend around the outer sides 504 of the tie bars 402. As a result, the inner sides 502 of the tie bars 402 are exposed.

In an embodiment, the lengths of the signal conductors 212 that extend around the tie bars 402 are jogged segments 506. The jogged segments 506 are out of plane with lengths of the signal conductors 212 on both ends of the jogged segments 506. For example, each jogged segments 506 extends from a first jog end 508 to a second jog end 510. The jog ends 508, 510 may be S-shaped curves or the like. The jogged segment 506 between the two jog ends 508, 510 is disposed along a different plane than the lengths of the same signal conductor 212 extending from each of the two jog ends 508, 510 away from the jogged segment 506, which are referred to herein as intervening lengths 512. Some of the intervening lengths 512 of a signal conductor 212 are longitudinally located between two jogged segments 506, and other intervening lengths 512 are located between one jogged segment 506 and either the mating contact 234 or the contact tail 236.

Figure 6:
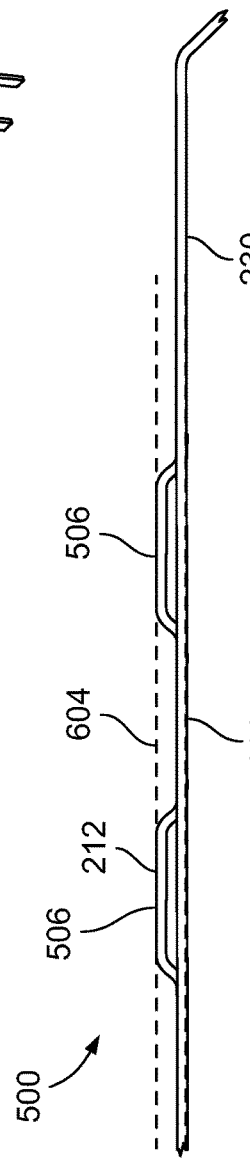
FIG. 6 shows a side view of a portion of the lead frame assembly shown in FIG. 5.

Additional reference is now made to FIG. 6, which shows a side view of a portion of the lead frame assembly 500 shown in FIG. 5. The side view in FIG. 6 shows a length of one of the ground conductors 230 which is oriented along a first plane 602. FIG. 6 also shows two jogged segments 506 of a signal conductor 212. The jogged segments 506 are oriented along a second plane 604 that is spaced apart from the first plane 602.

In an embodiment, the intervening lengths 512 of the signal conductors 212 are planar with the ground conductors 230 and the tie bars 402. For example, the intervening lengths 512 are oriented along the first plane 602 shown in FIG. 6, so the intervening lengths 512 of the signal conductor 212 are concealed behind the ground conductor 230 in FIG. 6. As shown in FIG. 5, the intervening lengths 512 of the signal conductors 212 may be disposed within the windows 408 of the ground lead frame 210.

During assembly, the signal conductors 212 may be held in place and secured in position relative to the ground lead frame 210 via the use of carrier strips (not shown). For example, the signal conductors 212 may define a signal lead frame, and carrier strips may be used to align the signal conductors 212 of the signal lead frame relative to the ground lead frame 210 without the signal conductors 212 engaging the ground lead frame 210. The carrier strips may be removed during the assembly process, such that the assembled product (e.g., the sub-assemblies 202, 204 shown in FIG. 2) lack carrier strips.

Figure 7:
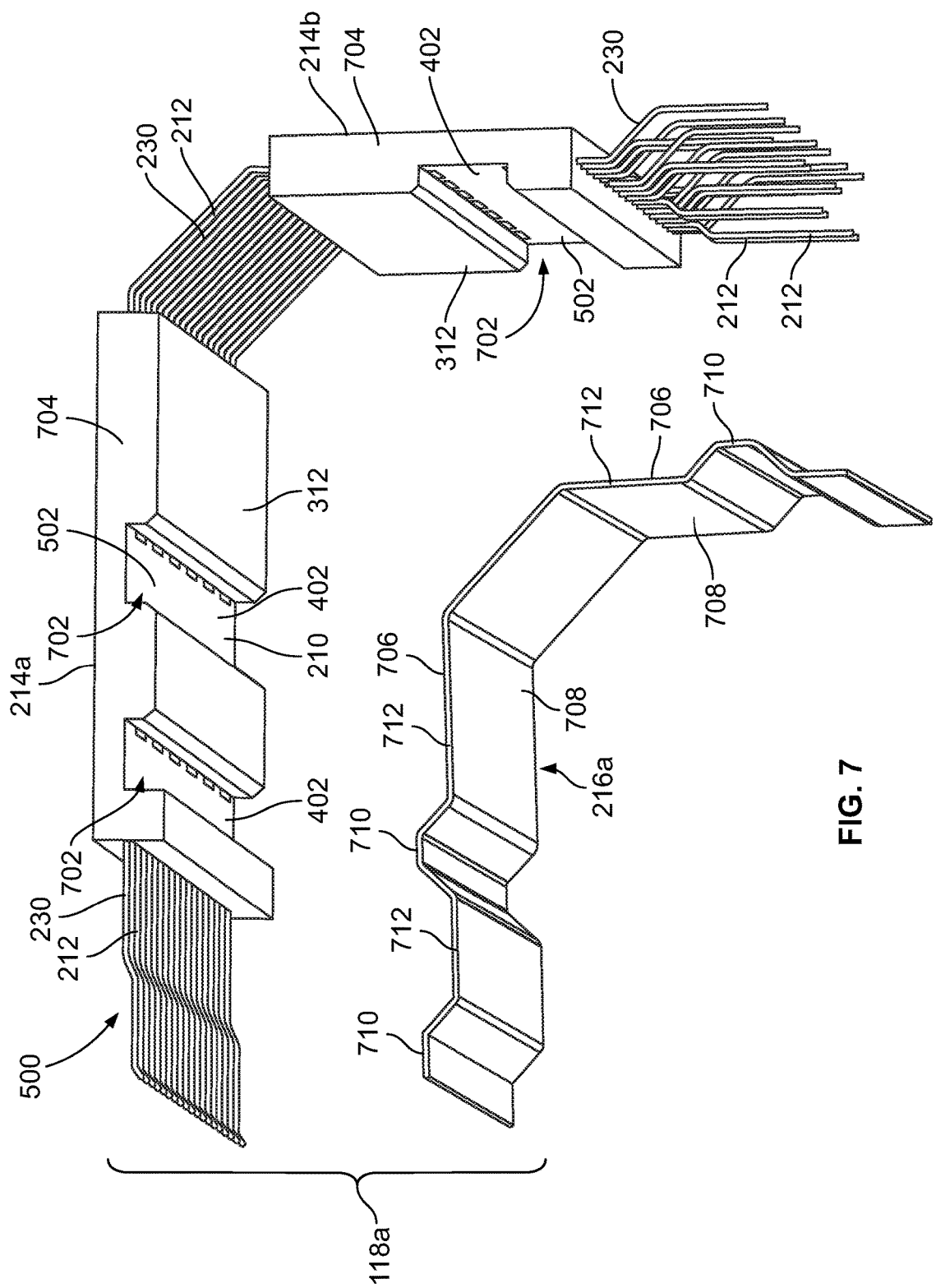
FIG. 7 is an exploded perspective view of an embodiment of the lead frame module of the electrical connector.

FIG. 7 is an exploded perspective view of an embodiment of the first lead frame module 118a of the electrical connector 102 shown in FIG. 2. The ground plate 216a of the first lead frame module 118a is poised for securing to the ground lead frame 210, which occurs during an assembly step of the electrical connector 102. Prior to securing the ground plate 216a, the dielectric holders 214a, 214b are assembled and/or formed onto the lead frame assembly 500 to hold the signal conductors 212 in place relative to the ground lead frame 210.

In the illustrated embodiment, the dielectric holders 214a, 214b fully cover the outer sides 504 (shown in FIG. 5) of the tie bars 402. The dielectric holders 214a, 214b define recesses 702 along the interior sides 312 thereof. The recesses 702 align with the tie bars 402. The inner sides 502 of the tie bars 402 are exposed within the corresponding recesses 702, such that the inner sides 502 are not covered (e.g., or at least not fully covered) by the dielectric holders 214a, 214b.

In an embodiment, the dielectric holders 214a, 214b have overmold bodies 704 that are formed via an over-molding process. The dielectric holders 214a, 214b are formed in-situ on the signal conductors 212 and the ground lead frame 210. The overmold bodies 704 may circumferentially encase lengths of the signal conductors 212 and the ground conductors 230. The overmold bodies 704 may fully cover the outer sides 504 (FIG. 5) of the tie bars 402 without fully covering the inner sides 502 of the tie bars 402. For example, the die or other molding device used to form the overmold bodies 704 may include shut-offs that engage the inner sides 502 of the tie bars 402 to block the dielectric fluid, which solidifies to form the overmold bodies 704, from flowing and settling along the inner sides 502 of the tie bars 402. The dielectric fluid may include a plastic material.

As shown in FIG. 7, the ground plate 216a has a mounting side 706 and a contact side 708 that is opposite the mounting side 706. The mounting side 706 faces the ground lead frame 210. The ground plate 216a optionally includes raised bands 710 that are jogged from planar segments 712 of the ground plate 216a. The raised bands 710 extend towards the ground lead frame 210. The raised bands 710 are positioned to align with the recesses 702 of the dielectric holders 214a, 214b, such that the raised bands 710 enter the corresponding recesses 702 to engage the tie bars 402 when assembled.

Figure 8:
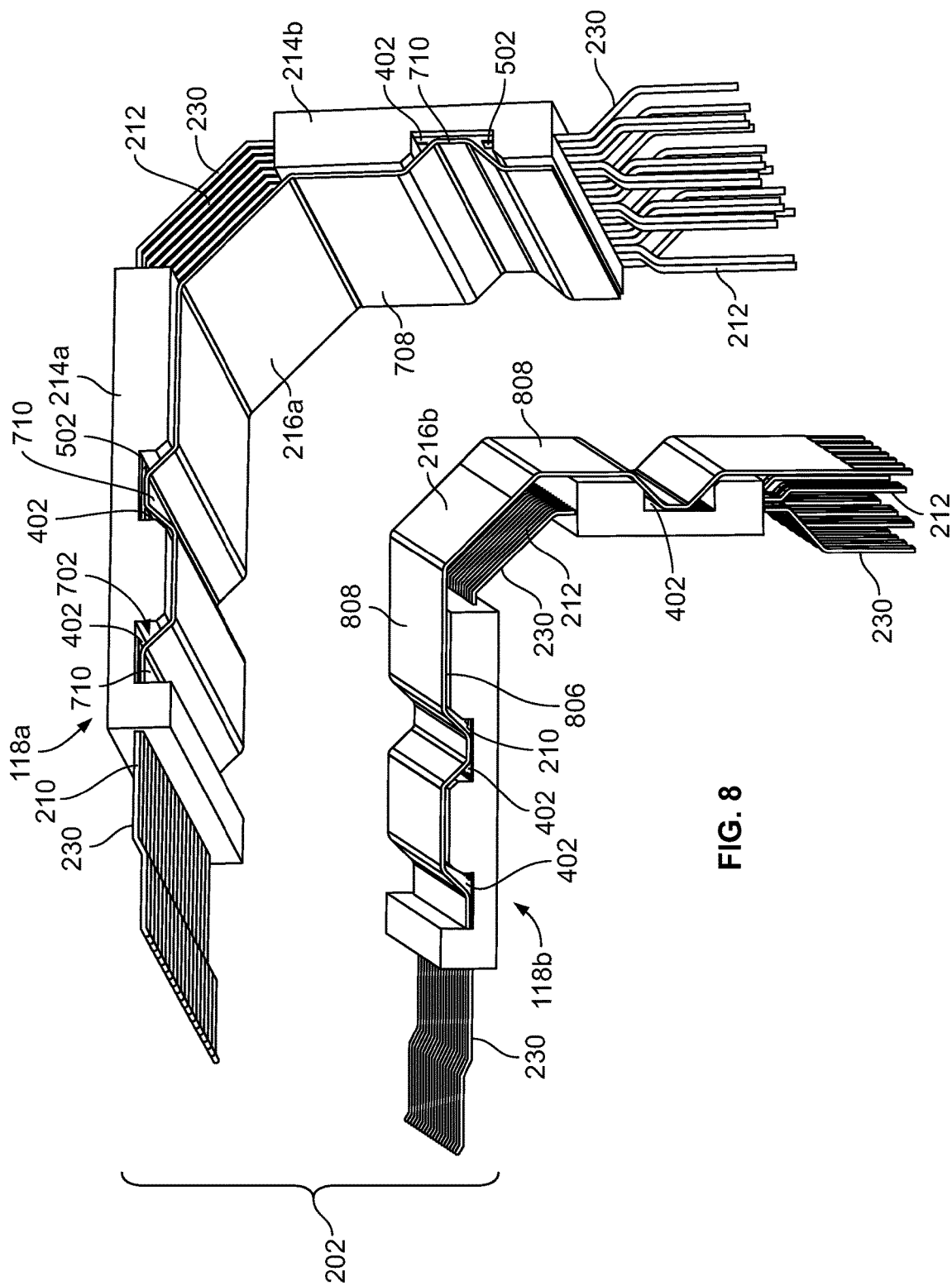
FIG. 8 is an exploded perspective view of two lead frame modules of the electrical connector showing a first lead frame module poised for engaging a second lead frame module at a module interface, according to an embodiment.

FIG. 8 is an exploded perspective view of an embodiment of the tall sub-assembly 202 of the electrical connector 102 (shown in FIG. 2) showing the first lead frame module 118a poised for engaging the second lead frame module 118b at the module interface 206 (shown in FIG. 3).

With initial reference to the first lead frame module 118a, the ground plate 216a engages the tie bars 402 of the ground lead frame 210 to electrically connect the ground plate 216a to the ground lead frame 210. For example, the raised bands 710 of the ground plate 216a extend into the recesses 702 of the dielectric holders 214a, 214b and engage the inner sides 502 of the corresponding tie bars 402. In an embodiment, the ground plate 216a is fixedly secured to the inner sides 502 of the tie bars 402. For example, the raised bands 710 may be secured to the tie bars 402 via welding, such as laser welding. Alternatively, the raised bands 710 may be secured to the tie bars 402, via an adhesive, a fastener, or the like. The ground plate 216a may, or may not, engage the interior sides 312 of the dielectric holders 214a, 214b.

The contact side 708 of the ground plate 216a faces towards the second lead frame module 118b. The ground plate 216b of the second lead frame module 118b is similar to the ground plate 216a, and generally mirrors the ground plate 216a. For example, the ground plate 216b includes a mounting side 806 that engages the tie bars 402 of the respective ground lead frame 210 of the second lead frame module 118a. The ground plate 216b has an opposite, contact side 808 that faces the first lead frame module 118a.

In an embodiment, the tall sub-assembly 202 attains an assembled state upon the first and second lead frame modules 118a, 118b moving towards one another to define the module interface 206 (shown in FIG. 3). The assembled state of the tall sub-assembly 202 is shown in FIGS. 2 and 3. In the assembled state, the contact side 708 of the ground plate 216a of the first lead frame module 118a engages the contact side 808 of the ground plate 216b of the second lead frame module 118b to electrically connect the first and second lead frame modules 118a, 118b. The ground plates 216a, 216b may engage each other at multiple points of contact along the length of the tall sub-assembly 202. The ground plates 216a, 216b provide electrical shielding along the module interface 206 between the signal conductors 212 of the first lead frame module 118a and the signal conductors 212 of the second lead frame module 118b. The first and second lead frame modules 118a, 118b may be retained in engagement with each other via walls of the housing 116 (shown in FIG. 1), fasteners, adhesives, or the like.

Figure 9:
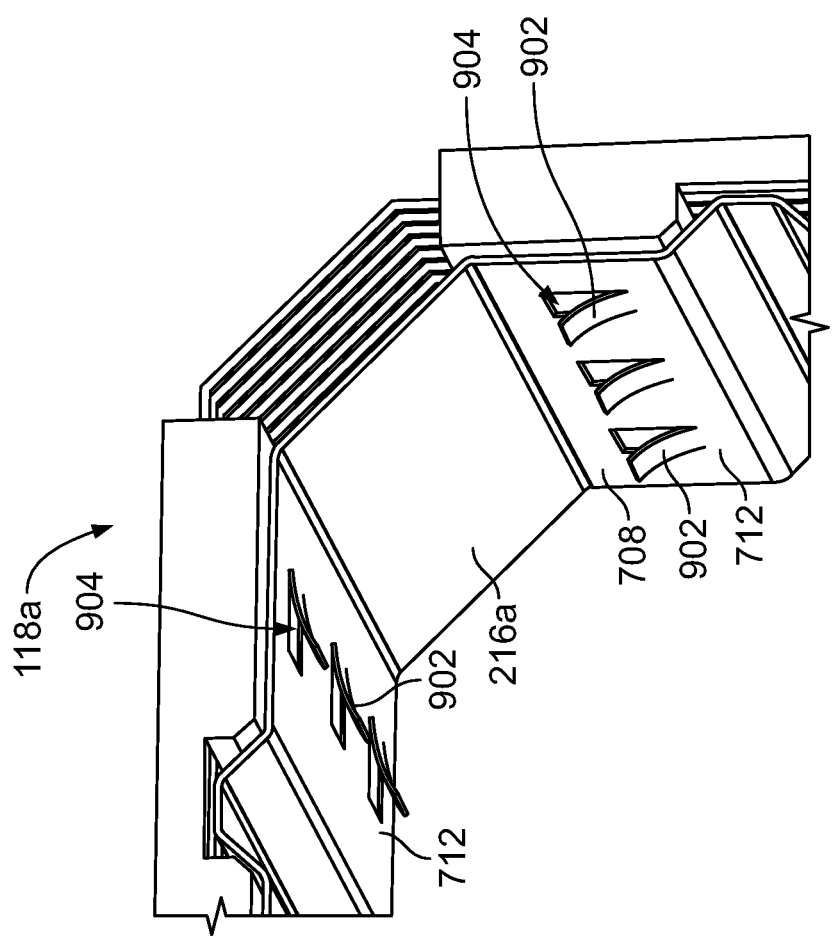
FIG. 9 is a perspective view of a portion of a lead frame module of the electrical connector according to an alternative embodiment.

FIG. 9 is a perspective view of a portion of the first lead frame module 118a of the electrical connector 102 (shown in FIG. 2) according to an alternative embodiment. In the illustrated embodiment, the ground plate 216a includes protrusions 902 that extend from the contact side 708 towards the second lead frame module 118b (FIG. 8). For example, the protrusions 902 may cross the module interface 206 (FIG. 3) and engage the ground plate 216b of the second lead frame module 118b to ensure that electrical connect is maintained between the first and second lead frame modules 118a, 118b. In the illustrated embodiment, the protrusions 902 are spring fingers that resiliently engage the second lead frame module 118b. For example, the spring fingers 902 are deflectable to resiliently exert a biasing force on the ground plate 216b. The spring fingers 902 optionally may be punched out of the ground plate 216a, yielding cutout apertures 904 along the planar segments 712 of the ground plate 216a. In an alternative embodiment, the protrusions 902 may have other shapes and/or may be compressible instead of deflectable.

Although FIGS. 4-9 primarily describe the tall sub-assembly 202 of the electrical connector 102, the descriptions of the lead frame modules 118a, 118b of the tall sub-assembly 202 may also apply to the lead frame modules 118c, 118d of the short sub-assembly 204 shown in FIGS. 2 and 3.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely example embodiments. Many other embodiments and modifications within the spirit and scope of the claims will be apparent to those of ordinary skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A lead frame module of an electrical connector, the lead frame module comprising:
   a ground lead frame including multiple ground conductors and a tie bar that extends between and connects the ground conductors;
   signal conductors interleaved with the ground conductors and disposed side-by-side with the ground conductors along a lateral axis of the lead frame module, the signal conductors having jogged segments that extend across the tie bar around an outer side of the tie bar without engaging the tie bar;
   a dielectric holder at least partially surrounding the signal conductors and the ground lead frame to secure the signal conductors relative to the ground lead frame; and
   a ground plate disposed along an interior side of the dielectric holder and engaging an inner side of the tie bar, which is opposite the outer side, to electrically connect the ground plate to the ground lead frame.

2. The lead frame module of claim 1, wherein longitudinal lengths of the signal conductors on both ends of the jogged segments are coplanar with the ground conductors.

3. The lead frame module of claim 1, wherein the dielectric holder is elongated parallel to the lateral axis.

4. The lead frame module of claim 1, wherein the ground lead frame is unitary and monolithic, such that the tie bar is integrally connected to the ground conductors.

5. The lead frame module of claim 1, wherein the dielectric holder fully covers the outer side of the tie bar, the inner side of the tie bar being exposed within a corresponding recess of the dielectric holder, the ground plate extending into the recess to engage the tie bar.

6. The lead frame module of claim 1, wherein the dielectric holder has an overmold body that circumferentially encases lengths of the signal conductors and the ground conductors, the overmold body fully covering the outer side of the tie bar without fully covering the inner side of the tie bar.

7. The lead frame module of claim 1, wherein the ground plate is fixedly secured to the inner side of the tie bar.

8. The lead frame module of claim 1, wherein the signal conductors and the ground lead frame define a vertical region, a horizontal region, and a bend region disposed between the vertical and horizontal regions, the vertical region oriented perpendicular to the horizontal region.

9. The lead frame module of claim 8, wherein the dielectric holder is a first dielectric holder that at least partially surrounds the signal conductors and the ground lead frame along the horizontal region, and the lead frame module further includes a second dielectric holder at least partially surrounding the signal conductors and the ground lead frame along the vertical region, the second dielectric holder spaced apart from the first dielectric holder.

10. The lead frame module of claim 1, wherein the ground plate has a mounting side and a contact side that is opposite the mounting side, the mounting side engaging the tie bar, wherein the ground plate includes spring fingers extending from the contact side that are configured to resiliently engage an adjacent lead frame module.

11. The lead frame module of claim 1, wherein the ground conductors of the ground lead frame extend parallel to each other, and the tie bar extends perpendicular to the ground conductors.

12. The lead frame module of claim 1, wherein the tie bar of the ground lead frame is a first tie bar of multiple tie bars of the ground lead frame that are spaced apart along the length of the lead frame module between a mating end and a mounting end.

13. An electrical connector comprising:
a first lead frame module and a second lead frame module disposed on opposite sides of a module interface, each of the first and second lead frame modules comprising:
a ground lead frame, signal conductors, and a ground plate, the ground lead frame including multiple ground conductors and a tie bar that extends between and connects the ground conductors, the signal conductors interleaved with the ground conductors, the signal conductors crossing the tie bar by extending around an outer side of the tie bar without engaging the tie bar, the ground plate engaging an inner side of the tie bar, which is opposite the outer side, to electrically connect the ground plate to the ground lead frame,
wherein the inner sides of the tie bars of the first and second lead frame modules face towards the module interface, and wherein the ground plate of the first lead frame module engages the ground plate of the second lead frame module at multiple points of contact to electrically connect the first and second lead frame modules.

14. The electrical connector of claim 13, wherein the signal conductors and the ground conductors of each of the first and second lead frame modules define mating contacts, the mating contacts of the first lead frame module arranged in a top row to engage a first side of a mating circuit card, the mating contacts of the second lead frame module arranged in a bottom row to engage a second side of the mating circuit card that is opposite the first side.

15. The electrical connector of claim 13, further comprising a housing that defines a port configured to receive a mating circuit card therein, the first and second lead frame modules commonly held within the housing.

16. The electrical connector of claim 13, wherein the respective tie bar of the ground lead frames is planar with the respective ground conductors of the ground lead frames.

17. The electrical connector of claim 13, wherein the signal conductors extend around the respective tie bar of the ground lead frames at jogged segments of the signal conductors which are non-planar with the respective ground conductors of the ground lead frames, wherein lengths of the signal conductors on both ends of the jogged segments are coplanar with the ground conductors.

18. The electrical connector of claim 13, wherein one or both of the ground plates of the first and second lead frame modules include protrusions extending across the module interface and resiliently engaging the other ground plate to electrically connect the first and second lead frame modules.

19. The electrical connector of claim 13, wherein each of the first and second lead frame modules further comprises a dielectric holder that at least partially surrounds the respective signal conductors and the respective ground lead frame to secure the signal conductors relative to the ground lead frame.

20. The electrical connector of claim 19, wherein the dielectric holder of the first lead frame module defines a recess along an interior side of the dielectric holder that faces towards the module interface, the inner side of the tie bar being exposed within the recess of the dielectric holder, wherein the ground plate of the first lead frame module extends into the recess and engages the inner side of the tie bar.

21. A lead frame module of an electrical connector, the lead frame module comprising:
a ground lead frame including multiple ground conductors that extend parallel to one another and a tie bar that extends between and connects the ground conductors;
signal conductors interleaved with the ground conductors and disposed side-by-side with the ground conductors along a lateral axis of the lead frame module, the signal conductors having jogged segments that extend across the tie bar around an outer side of the tie bar without engaging the tie bar; and
a dielectric holder having an overmold body that encases lengths of the signal conductors and the ground conductors to secure the signal conductors relative to the ground lead frame, the overmold body covering the outer side of the tie bar,
wherein an inner side of the tie bar, which is opposite the outer side, is exposed through the dielectric holder for engaging a ground plate to electrically connect the ground lead frame to the ground plate.

* * * * *